United States Patent [15] 3,706,918

Barone et al. [45] Dec. 19, 1972

[54] SILICON-SILICON DIOXIDE INTERFACE OF PREDETERMINED SPACE CHARGE POLARITY

[72] Inventors: Frank J. Barone, 711 East Manhattan Drive, Tempe, Ariz. 85281; Donald L. Tolliver, 75 East Hoover Avenue, Phoenix, Ariz. 85004

[22] Filed: Oct. 5, 1970

[21] Appl. No.: 78,242

Related U.S. Application Data

[62] Division of Ser. No. 748,036, July 26, 1968

[52] U.S. Cl. .......317/235 R, 317/235 B, 317/235 AG

[51] Int. Cl. ..............................................H01l 3/00

[58] Field of Search...............................317/234, 235

[56] References Cited

UNITED STATES PATENTS 3,386,163 6/1968 Brennemann ..........................29/571

*Primary Examiner*—John W. Huckert
*Assistant Examiner*—E. Wojciechowicz
*Attorney*—Mueller, Aichele & Gillman

[57] ABSTRACT

In the fabrication of a semiconductor device having a silicon-silicon dioxide interface, the polarity of the space charge region associated with the interface is predetermined by a method which begins with the step of pretreating the silicon surface with a selected reagent capable of inducing the desired space charge polarity. For example, a pretreatment with chromic acid induces a negative space charge region, whereas a pretreatment with nitric acid induces a positive charge. The interface is then formed by vapor deposition of a silicon dioxide layer on the silicon surface. The pretreatment has been found capable of inducing a predetermined charge when the interface is provided by vapor deposition, but is wholly ineffective when the interface is provided by thermal oxidation. It is well known that thermal oxidation of a silicon surface inherently produces an interface having a positive space charge region.

1 Claim, 4 Drawing Figures

P- CHANNEL DEPLETION MODE MOS DEVICE

PATENTED DEC 19 1972 3,706,918

PRETREATMENT
WITH NITRIC ACID

PRETREATMENT
WITH CHROMIC ACID

STABILIZED BIPOLAR
TRANSISTOR

P- CHANNEL DEPLETION
MODE MOS DEVICE

INVENTOR.
Frank J. Barone and
BY Donald L. Tolliver
Mueller & Aichele
Att'ys

SILICON-SILICON DIOXIDE INTERFACE OF PREDETERMINED SPACE CHARGE POLARITY

This is a division of application Ser. No. 748,036, filed July 26, 1968.

BACKGROUND

This invention relates to the fabrication of silicon semiconductor devices, and more particularly to the formation of a silicon-silicon dioxide interface having a predetermined space charge polarity.

It has been repeatedly observed in the fabrication of semiconductor devices that the thermal oxidation of a silicon surface generates an immobile positive space charge region within the oxide layer adjacent the interface between the silicon dioxide and the silicon. The magnitude of the charge will vary depending upon the oxidation conditions, but measurements have shown it to be typically on the order of $10^{11}$ charges per square centimeter of interfere. The presence of a positive space charge region within a thermal oxide layer has a very substantial effect upon the bulk properties of the silicon at the interface. In P-type silicon, for example, the positive charge within a thermal oxide layer causes the equal accumulation of negative charge in the silicon at the interface, which acts to deplete the P-type silicon. If enough charge accumulates, the material actually inverts to N-type silicon at the interface, causing an intolerable degeneration of device characteristics, particularly in passivated NP diodes and NPN transistors.

This same phenomenon has seriously hampered the development of insulated gate field-effect transistors, commonly referred to as MOS devices. For example, a positive space charge at the interface between silicon and silicon dioxide tends to increase the threshold voltage of P-channel enhancement mode MOS devices. The ability to produce a stable negative space charge at the interface would allow the fabrication of low-threshold P-channel enhancement MOS devices, and also the fabrication of P-channel depletion devices having a low turn-off voltage. A low threshold, or a low turn-off voltage, provides maximum speed, low power and improved matching or interfacing with bipolar circuits.

THE INVENTION

An object of the invention is to improve the fabrication of semiconductor devices having a silicon-silicon dioxide interface. A further object of the invention is to provide a fabrication capability which permits one to select in advance the space charge polarity associated with a silicon-silicon dioxide interface.

It is a more specific object of the invention to fabricate stable oxide-passivated NP diodes and NPN transistors having a silicon-silicon dioxide interface of negative space charge polarity. It is a further object of the invention to fabricate stable insulated gate field-effect transistors having a silicon-silicon dioxide interface of negative space charge polarity, including particularly P-channel enhancement MOS devices.

A primary feature of the invention lies in the selection of a suitable reagent for the pretreatment of a silicon surface to induce the desired interface charge. Certain acids, such as chromic acid or hydrofluoric acid, will induce a negative charge, whereas nitric acid or sulfuric acid will induce a positive charge. Boiling deionized water induces a negative charge.

The exact mechanism responsible for the induced charge is not known. A correlation has been observed, however, between the ability of a reagent to oxidize silicon and its ability to induce a positive space charge region in the oxide layer adjacent an oxide-silicon interface. That is, a strongly oxidizing reagent induces a positive space charge, whereas a reagent having a relatively weaker tendency to oxidize silicon will induce a negative space charge.

An additional feature of the invention lies in the step of forming the silicon-silicon dioxide interface by vapor deposition. The pretreatment of the invention is ineffective when used in combination with thermal oxidation as a means of forming the interface.

An additional feature of a preferred embodiment of the invention lies in the step of depositing high purity, undoped silicon dioxide until a layer having 2000–5000 angstroms thickness is formed, followed by the step of depositing phosphorus-doped silicon dioxide glass.

An additional feature of the preferred embodiments lies in the step of initially depositing the silicon dioxide and glass layers at a temperature of 400°C to 600°C, followed by annealing of the glass at an elevated temperature of 600° to 1000°C.

The invention is embodied in a method for fabrication of a semiconductor device having a silicon-silicon dioxide interface of predetermined ionic space charge polarity, beginning with the step of treating a silicon surface with a selected reagent to induce the desired polarity. Thereafter, the treating agent is rinsed away, followed by the vapor deposition of silicon dioxide on the treated silicon surface to form an interface of the desired polarity.

The invention is further embodied in a method for the fabrication of a semiconductor device having a silicon-silicon dioxide interface of negative ionic space charge polarity which comprises treating a silicon surface with an agent selected from the group consisting of a chromic acid solution, hydrofluoric acid and boiling deionized water, and thereafter depositing silicon dioxide on said surface by exposing the surface to a vaporous, decomposable silicon compound under conditions selected to deposit silicon dioxide thereon.

The invention is further embodied in a method for the fabrication of a silicon-silicon dioxide insulated gate field-effect transistor for P-channel depletion mode operation beginning with the step of providing an N-type monocrystalline silicon substrate having diffused P-type source and drain regions. Any oxide which may have accumulated on the silicon surface in the gate region during diffusion is then removed, followed by the step of pretreating the exposed portion of the silicon substrate surface with a reagent selected from the group consisting of a chromic acid solution, hydrofluoric acid, and boiling deionized water. Silicon dioxide is then deposited on the treated surface followed by the step of forming electrode contacts for the source and drain regions, respectively, and then forming the gate electrode on the deposited silicon dioxide.

The pretreatment step generally consists of immersing the silicon wafer in a bath of a treating solution at elevated temperature for a few minutes, followed by rinsing with deionized water at room temperature. The time and temperature of the treatment have not been found critical, except that treatment with deionized water must be conducted at or near the boiling point. It is generally preferred to maintain each of the treatment solutions at or near its boiling point and to immerse the wafers for one to five minutes. For example, when treating with chromic or nitric acid in aqueous solution, it has been found effective to immerse the wafers for 5 minutes at 95° to 100°C. Concentrated acids are generally employed in order to take advantage of their well-known ability to clean the surface of the wafers, simultaneously with their newly discovered ability to induce a desired interface charge. Dilute solutions are frequently useful, however, to induce a desired charge of reduced magnitude, if it should be desired to preclean the wafers by other techniques.

It is important to avoid any substantial intervening disturbance of the silicon surface between the time of the desired pretreatment step and the subsequent vapor deposition of the oxide layer. Rinsing with deionized water and acetone at room temperature are desired intermediate steps, particularly when the pretreatment involves the use of a nonvolatile substance. That is, the charge inducing effect of the treating agent does not depend upon the presence of any readily detectable residual traces of treating agent on the silicon surface during the subsequent deposition of silicon dioxide. In fact, the presence of substantial amounts of chromic acid or other such treating agent would be highly detrimental to the device characteristics.

Sequential treatment, first with an agent known to induce positive charge, followed by treatment known to induce negative charge, or vice-versa, will generally lead to the inducement of that charge which is characteristic of the treating agent used as the final step in the sequence. For example, treatment with nitric acid, followed by treatment with chromic acid, followed by rinsing with deionized water and acetone to remove all detectable traces of acid, is known to result in a negative charge at the interface upon subsequent deposition of silicon dioxide, just as though the chromic acid had been used alone.

The subsequent deposition of a silicon dioxide layer on a treated silicon surface is carried out in accordance with known techniques. Preferably, a stream of silane diluted with argon or nitrogen is passed in contact with the substrate, while the substrate is maintained at a temperature of about 425° to 475°C. For example, one part silane by volume to 400 parts diluant is suitable. An open system is commonly used for economy, but is not necessarily preferred, with the substrate being simultaneously exposed to the atmosphere as a source of oxygen, which reacts with the silane to deposit silicon dioxide on the hot substrate.

After the deposition of 2000 to 5000 angstroms of highly pure silicon dioxide, it is generally preferred to dope additional glass thickness with phosphorus supplied in the form of a dilute phosphine stream combined with the above-mentioned silane stream passed in contact with the substrate in the same manner as with the undoped silane glass. The ratio of phosphine to silane is selected to provide a glass film having from $10^{18}$ up to $10^{21}$ atoms of phosphorus per cubic centimeter of glass.

After completion of the glass layer of the deposition step, a post-deposition annealing step is preferred which involves a baking at elevated temperatures, e.g., 800°C to 1000°C, in order to modify internal stresses and to provide a silicon dioxide structure which more closely matches the density of thermally grown silicon dioxide.

DRAWINGS

Figure 1:
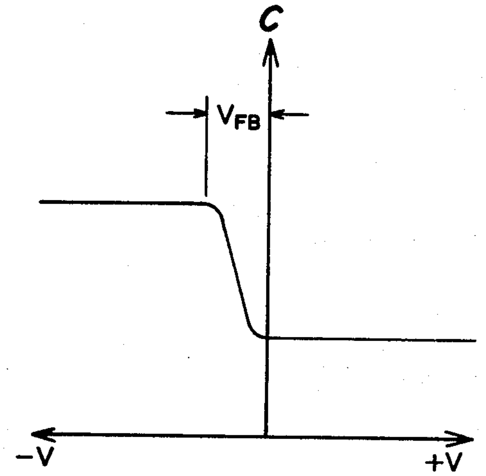
FIG. 1 is a capacitance-voltage plot of a silicon-silicon dioxide interface space charge region induced by pretreatment with nitric acid.

In FIG. 1, the horizontal displacement of the curve toward a more negative voltage indicates that the space charge region has positive polarity, and a magnitude $V_{FB}$.

Figure 2:
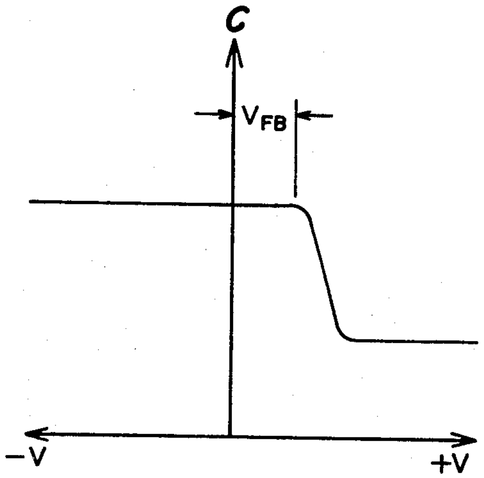
FIG. 2 is a capacitance-voltage plot of a silicon-silicon dioxide interface space charge region induced by pretreatment which a chromic acid solution.

In FIG. 2, the horizontal displacement of the curve toward a more positive voltage indicates a negative space charge region of magnitude $V_{FB}$.

Figure 3:
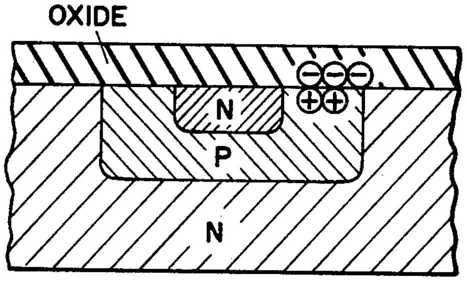
FIG. 3 is a greatly enlarged cross section of an oxide-passivated bipolar transistor stabilized by pretreatment of the silicon surface with chromic acid solution to induce a negative space charge region at the silicon-silicon dioxide interface.

In FIG. 3, the negative space charge region in the oxide near the interface induces a positive charge in the silicon surface, which stabilizes the P-type base region and therefore prevents channelling between the base and collector junctions.

Figure 4:
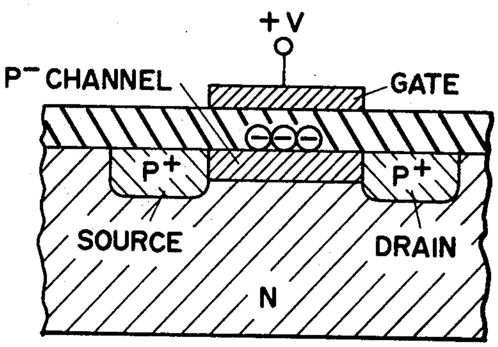
FIG. 4 is a greatly enlarged cross section of a P-channel depletion mode MOS field-effect transistor having a stable negative interface charge region.

FIG. 4 illustrates the use of a negative space charge region in the fabrication of a P-channel depletion mode MOS device. The high resistivity P-type conductive channel is induced by the negative space charge region in the oxide layer near the interface. It will be apparent to those skilled in the art that the device of FIG. 4 has a relatively high resistivity substrate in order to permit an induced reversal of conductivity type at the interface due to the space charge region in the oxide layer. A more heavily doped, low resistivity substrate would resist any induced formation of such a conductive channel. Indeed, such a device would be suitable for enhancement mode operation, and would have a threshold voltage that can be readily controlled in accordance with the invention. That is, the threshold voltage of such a device is inversely proportional to the magnitude of negative space charge.

P-type channel enhancement mode, N-channel depletion, and N-channel enhancement mode MOS field-effect transistors are also readily fabricated with a space charge region having a polarity predetermined in accordance with the invention.

We claim:

1. A P-channel depletion mode MOS field-effect transistor comprising an N-type monocrystalline silicon substrate, diffused P-type source and drain regions in said substrate, a silicon-dioxide insulating layer covering said diffused regions, said layer being 2000–5000 angstroms in thickness and being of high purity silicon dioxide and a gate electrode on said oxide layer, the interface between said substrate and oxide having a space charge region of negative polarity, whereby a P-type conductive channel is induced between source and drain.

* * * * *